3,573,096

SILANE METHOD FOR MAKING SILICON NITRIDE

Nigel C. Tombs, Stow, Mass., assignor to Sperry Rand Corporation, Great Neck, N.Y.

No Drawing. Filed June 23, 1965, Ser. No. 466,454
Int. Cl. C27c *11/00*
U.S. Cl. 117—201 3 Claims

ABSTRACT OF THE DISCLOSURE

A method for the production of a layer of silicon nitride on a substrate material by placing the substrate in a reactor chamber at a temperature in the range from about 600° C. to about 1000° C. and passing silane and ammonia over the substrate.

The present invention generally relates to methods for the production of silicon nitride layers on substrate materials and, more particularly, to such a method using gaseous silane and a gaseous material comprising nitrogen wherein reaction takes place at temperatures substantially below 1000° centigrade.

In the current state of the art relating to silicon integrated circuits, thermally-grown layers of silicon oxide play a central role. Said oxide serves as a diffusion mask, as a passivating layer over p-n junctions that extend to exposed surfaces, and as the insulating dielectric in MOS (metal-oxide-semiconductor) transistors and diodes. The oxide technology has achieved a great advance in simplicity, reliability and cost relative to earlier methods. At the present time, however, with the demand increasing for more complex integrated circuits characterized by higher reliability, smaller size, and low cost, the limitations of the oxide technology are beginning to be felt.

There are several areas in which oxidized silicon layers and existing methods for its preparation are less than adequate. In order to obtain appreciable oxide formation, reaction temperatures in excess of 1000° C. must be maintained for periods of several hours. During such high temperature processing, the dopants within the silicon upon which the oxide layer is to be formed diffuse through the silicon to alter the profile of p-n junctions produced prior to the oxidation step. In general, oxide layers are a fraction of a micron in thickness. The nature of the oxide formation process requires that the oxygen diffuse through the oxide being formed in order to reach the underlying silicon surface. After the oxide layer has thickened to a few microns, penetration of the oxygen through the oxide layer substantially ceases for reasonable values of oxidization time and reaction temperature. The relatively thin oxide layers obtainable do not provide adequate isolation of underlying silicon devices from metallic layers and other materials which subsequently are deposited on top of the oxide layer or from the long-term degrading effects of ambient atmosphere on the silicon devices being protected. The ability of the oxide layer to function reliably as a diffusion mask also is seriously handicapped by the inherent thickness limitation.

One object of the present invention is to provide a method for the formation of silicon nitride at low reaction temperatures which are non-injurious to semiconductor devices.

Another object is to provide a method for forming silicon nitride on a silicon substrate at temperatures within the range of about 600° centigrade to about 1000° centigrade.

A further object is to provide a method for depositing silicon nitride in controllable amounts up to mils in thickness on a substrate.

An additional object is to provide a method for the formation of silicon nitride which yields non-corrosive by-product materials.

These and other objects of the present invention, as will appear from the reading of the following specification, are achieved in the disclosed embodiment by the reaction of silane ($SiH_4$) and ammonia ($NH_3$) in a reaction chamber at a temperature within a range from about 600° C. to about 1000° C. It is believed that the silane decomposes to yield atomic silicon and the ammonia decomposes to yield nitrogen which recombine and deposit on a substrate surface within the reaction chamber to yield a layer of silicon nitride. In the disclosed embodiment, the substrate silicon is heated to about 900° C. The rate of silicon nitride deposition may be controlled by varying the temperature of the substrate surface within the range from about 600° C. to about 1000° C. and by changing the flow rates of the silane and ammonia gases passing over said surface.

In more detail, the reaction of the present invention is carried out, in a typical case, in a vertical reactor quartz tube of about 1" diameter in which a substrate is located about 1" below the gas inlet port at the top of the tube. The substrate may consist of single-crystal silicon having a polished surface prepared by mechanical polishing. The surface of the substrate within the reactor is heated dielectrically to about 900° C. at atmospheric pressure in the presence of 1% ammonia by volume in argon flowing at the rate of 48 milliliters per minute. Then, a silane mixture is added to the ammonia-argon mixture. The silane mixture comprises 1% silane by volume in argon flowing at the rate of 12 milliliters per minute. After one hour, the silane flow is discontinued and the substrate is allowed to cool to room temperature in the ammonia-argon atmosphere. The thickness of the silicon nitride coating on the substrate resulting from the use of the aforementioned reactor tube geometry, reaction temperature, and gas flow rates is approximately 30 microns. The function of the argon simply is to transport the silane and ammonia gases through the reactor tube.

In general, an excess of ammonia (on a mole basis) is used so as to satisfy the equation $$3SiH_4+4NH_3 \rightarrow Si_3N_4+12H_2$$

It will be noted that the reaction yields the single by-product of free hydrogen. This is in contrast to known prior art processes for producing silicon nitride which employ silicon halides and yield acids as by-products. Such processes, of course, are incompatible with the formation of silicon nitride on metals or semiconductors inasmuch as the acid by-products would attack the substrate upon which the layer is to be formed.

It is believed that the total reaction of the present invention takes place at relatively low temperatures because the silane and ammonia starting materials readily decompose to yield nascent silicon and nitrogen which, in turn, readily combine to form silicon nitride. Commercially available silicon and nitrogen, as opposed to the silicon and nitrogen obtained via the decompositions of the aforementioned respective compounds, require reaction temperatures considerably in excess of 1000° C. in order to form silicon nitride.

Silicon nitride layers produced in accordance with the method of the present invention have been examined by reflection electron diffraction. The patterns obtained were rather diffuse, suggesting that the layers are largely amorphous. There have been some indications that layers prepared at the higher end of the temperature range tended to have greater crystallinity.

Silicon nitride is a highly inert compound. Fast-acting solvents for the bulk material are not generally known. It has been found, however, that hydrofluoric acid is an effective solvent for the thicknesses of material contemplated by the present invention, i.e., in the range from the microns to mils. Concentrated hydrofluoric acid removes a silicon nitride layer of several microns thickness in less than a minute. Dilute hydrofluoric acid permits the silicon nitride layer to be removed controllably in a manner analogous to the way in which oxide layers are thinned in the present state of the art. Controlled-area etching of the silicon nitride layer can be accomplished by using wax as a mask against the acid etching. Conventional photo-resist masking also is applicable as in the case with oxide etching procedures.

What is claimed is:

1. The method of depositing silicon nitride on a semiconductor substrate without significant alteration of p–n junction profiles therein, said method comprising the steps of placing said substrate in a reactor chamber, heating said substrate to a temperature in the range from about 600° C. to about 1000° C., passing a gaseous mixture of ammonia and argon and a gaseous mixture of silane and argon over said substrate.

2. The method of depositing silicon nitride on a semiconductor substrate without significant alteration of p–n junction profiles therein, said method comprising the steps of placing said substrate in a reactor chamber, heating said substrate to a temperature in the range from about 600° C. to about 1000° C. in the presence of a mixture of ammonia and argon, and mixing said ammonia and argon mixture with a mixture of silane and argon.

3. The method of depositing silicon nitride on a semiconductor substrate without significant alteration of p–n junction profiles therein, said method comprising the steps of placing said substrate in a reactor chamber, heating said substrate to a temperature in the range from about 600° C. to about 1000° C. in the presence of a mixture of ammonia and argon, mixing said ammonia and argon mixture with a mixture of silane and argon, discontinuing the flow of said silane-argon mixture, and allowing said substrate to cool to room temperature in the presence of said ammonia-argon mixture.

References Cited

UNITED STATES PATENTS

| | | | |
|---|---|---|---|
| 2,839,426 | 6/1958 | Gerby | 117—106 |
| 2,926,071 | 2/1960 | Alexander | 23—204X |
| 2,938,772 | 5/1960 | Enk et al. | 117—106A |
| 3,122,450 | 2/1964 | Barnes et al. | 117—106X |
| 3,149,398 | 9/1964 | Sprague et al. | 117—106UX |
| 3,200,001 | 8/1965 | Merkel et al. | 117—106A |
| 3,200,015 | 8/1965 | Kuntz | 117—106X |
| 3,328,214 | 6/1967 | Hugle | 148—175 |

FOREIGN PATENTS

| | | | |
|---|---|---|---|
| 1,190,308 | 3/1959 | France | 117—106 |

OTHER REFERENCES

Powell et al.: Vapor Plating, 1955, pp. 95 to 97, 120, 121 and 131 relied upon.

Translation of French patent, 1,190,308, 8 pages in translation.

ALFRED L. LEAVITT, Primary Examiner

W. E. BALE, Assistant Examiner

U.S. Cl. X.R.

23—356; 117—106